US008658571B2

(12) United States Patent
van Driessche et al.

(10) Patent No.: US 8,658,571 B2
(45) Date of Patent: Feb. 25, 2014

(54) WET-CHEMICAL METHOD FOR PRODUCING HIGH-TEMPERATURE SUPERCONDUCTOR

(75) Inventors: Isabel van Driessche, Waasmunster (BE); Pieter Vermeir, Lokeren (BE); Serge Hoste, Merelbeke (BE); Michael Baecker, Cologne (DE)

(73) Assignee: BASF SE, Ludwigshafen (DE)

( * ) Notice: Subject to any disclaimer, the term of this patent is extended or adjusted under 35 U.S.C. 154(b) by 638 days.

(21) Appl. No.: 12/726,421

(22) Filed: Mar. 18, 2010

(65) Prior Publication Data

US 2010/0173785 A1 Jul. 8, 2010

Related U.S. Application Data

(63) Continuation of application No. PCT/EP2009/000214, filed on Jan. 15, 2009.

(30) Foreign Application Priority Data

Jan. 17, 2008 (DE) .......................... 10 2008 004 818

(51) Int. Cl.
*H01L 39/24* (2006.01)
*H01B 12/00* (2006.01)

(52) U.S. Cl.
USPC ........... 505/447; 505/470; 505/126; 505/236; 505/734; 427/62; 427/63; 427/377; 174/125.1

(58) Field of Classification Search
USPC ......... 505/150, 237, 430, 434, 440, 446, 470, 505/735, 737; 427/62, 126.3; 428/457, 469, 428/698, 701, 702, 930
See application file for complete search history.

(56) References Cited

U.S. PATENT DOCUMENTS

| 4,880,772 | A | * | 11/1989 | Pederson et al. | 505/446 |
| 5,066,636 | A | * | 11/1991 | Liu et al. | 505/440 |
| 6,562,761 | B1 | | 5/2003 | Fritzemeier et al. | |
| 7,109,151 | B2 | | 9/2006 | Lee | |
| 2002/0086799 | A1 | | 7/2002 | Araki et al. | |

(Continued)

FOREIGN PATENT DOCUMENTS

| WO | 0060132 | 10/2000 | |
| WO | WO 2006021370 | * 3/2006 | ............. H01L 39/24 |
| WO | 2007017073 A2 | 2/2007 | |

OTHER PUBLICATIONS

Schoofs et al, "A water-based sol-gel technique for chemical solution deposition of (RE)Ba2Cu3O7-y (RE=Nd and Y) superconducting thin films," Supercond. Sci. Technol. 19 (2006) 1178-1184.*

(Continued)

*Primary Examiner* — Stanley Silverman
*Assistant Examiner* — Kallambella Vijayakumar
(74) *Attorney, Agent, or Firm* — Edell, Shapiro & Finnan, LLC

(57) ABSTRACT

The invention relates to a method for the wet chemical production of an HTSL on a carrier, wherein an HTSL precursor solution comprising no trifluoroacetate may be utilized if the same is heated to a temperature $T_s$ during the heat treatment of the HTSL precursor, wherein the remaining substances of the HTSL precursor solution form at least a partial melt, which is below the temperature at which $RE_2BaCuO_x$ is formed, and which is deposited from the liquid phase while forming a peritectic.

21 Claims, 1 Drawing Sheet

(56) References Cited

U.S. PATENT DOCUMENTS

| | | | |
|---|---|---|---|
| 2002/0139960 | A1 | 10/2002 | Manabe et al. |
| 2002/0144838 | A1 | 10/2002 | Fritzemeier et al. |
| 2006/0094603 | A1* | 5/2006 | Li et al. .................. 505/445 |
| 2007/0197397 | A1* | 8/2007 | Backer et al. ............. 505/430 |
| 2007/0249841 | A1 | 10/2007 | Backer |
| 2008/0039330 | A1 | 2/2008 | Wolf et al. |
| 2009/0137401 | A1 | 5/2009 | Paranthaman et al. |

OTHER PUBLICATIONS

Dawley, J.T. et al., Thick Sol-gel Derived YBa2Cu3O7-d Films, IEEE Transactions on Applied Superconductivity, vol. II, No. 1, Mar. 2001, pp. 2873-2876.*

PCT International Search Report in counterpart International Application No. PCT/EP2009/000214, dated Dec. 7, 2009.

Grader, G. S. et al., "Synthesis of Nd123 Superconducting Powder via Oxalate Coprecipitation," Physica C, vol. 290 (1997), No. 1-2, pp. 70-88.

McHale, J., et al., "Simplified Preparation of REBa2Cu3O7-x Via the Acetate Method," Abstract, Compendex [online], Accession No. EIX95142566107, Journal of Materials Research, Jan. 1995.

McIntyre, P. C. et al., "Effect of Growth Conditions on the Properties and Morphology of Chemically Derived Epitaxial Thin Films of Ba2YCu3O7-x on (001) LaAlO3," Journal of Applied Physics, American Institute of Physics, New York, U.S., vol. 4, No. 71, Feb. 15, 1992, pp. 1868-1877.

McIntyre, P.C. et al., "Metalorganic Deposition of High-JCBA2YCU3O7-X Thin Films from Trifluoroacetate Precursors onto (100) SRT1O3," Journal of Applied Physics, American Institute of Physics, New York, U.S., vol. 68, No. 8, Oct. 15, 1990, pp. 4183-4187.

Dawley, J.T. et al., Thick Sol-gel Derived YBa2Cu3O7-d Films, IEEE Transactions on Applied Superconductivity, vol. II, No. 1, Mar. 2001, pp. 2873-2876.

Glavee, G.N. et al., Low Temperature Preparation of BaCeO3 and Ce0.75Zr0.25O2 Thin Films Using Sol-Gel Processing Techniques, Materials Research Bulletin, vol. 34, No. 5, Mar. 15, 1999, pp. 817-825.

Takahashi, Y. et al., Preparation of YBCO films on CeO2/Zr2Gd2O7/Hastelloy tapes by the TFA-MOD method, Physica C, North-Holland Publishing, vol. 378-381, Oct. 2002, pp. 1024-1027.

Sheth, Atul, et al., Bench Scale Evaluation of Batch Mode Dip-Coating of Sol-Gel LaAlO3 Buffer Material, IEEE Transactions on Applied Superconductivity, vol. 9, No. 2, Jun. 1999, pp. 1514-1518.

Celik E et al: "Nb-doped SrTi03 buffer layers on LaAl03 substrates by metalorganic deposition for YBCO superconducting films", Materials Science and Engineering B, Elsevier Sequoia, Lausanne, CH, vol. 110, No. 1, Jun. 25, 2004, pp. 94-102, XP004507156 ISSN: 0921-5107 the whole document.

Castano O et al: "Epitaxial nucleation and growth of buffer layers and Y123 coated conductors deposited by metal-organic decomposition", Physica C, North-Holland Publishing, Amsterdam, NL, vol. 372-376, Aug. 2002, pp. 806-809, XP004375539 ISSN: 0921-4534 the whole document.

Chirayil T G et al: "Epitaxial growth of La2Zr2O7 thin films on rolled Ni-substrates by sol-gel process for high Tc superconducting tapes", Physica C, North-Holland Publishing, Amsterdam, NL, vol. 336, No. 1-2, Jul. 2000, pp. 63-69, XP004208161 ISSN: 0921-4534 the whole document.

Celik E et al: "Fabrication of La2Zr2O7 buffer layers on Ni tapes by reel-to-reel sol-gel technique", Materials Science and Engineering B, Elsevier Sequoia, Lausanne, CH, vol. 106, No. 2, Jan. 25, 2004, pp. 182-190, XP004482186 ISSN: 0921-5107 the whole document.

Bhuiyan M S et al: "MOD approach for the growth of epitaxial Ce02 buffer layers on biaxially textured Ni-W substrates for YBCO coated conductors", Supercond. Sci. Technol., vol. 16, Oct. 17, 2003, pp. 1305-1309, XP002362939 UK the whole document.

Annavarapu S et al: "Progress towards a low-cost coated conductor technology", Physica C, North-Holland Publishing, Amsterdam, NL, vol. 341-348, Nov. 2000, pp. 2319-2322, XP004761706 ISSN: 0921-4534 the whole document.

Applied Physics Letter 52 (1998), pp. 2077-2079, Entitled "Superconducting oxide films with high transition temperature prepared from metal trifluoroacetate precursors" by A. Gupta et al.

IEEE Transaction on Applied Superconductivity and Technology 16, (2003), Entitled "Fabrication of long lengths of YBCO coated conductors using a continuous reel-to-reel dip[- coating unit", pp. 3146-3149.

Superconductor Science and Technology 16, (2003), Entitled "Review of a chemical approach to YBa2Cu3O7-x-coated superconductors—metalorganic deposition using trifluoroacetates", by T. Araki and I Hirabayashi.

Co-pending U.S. Appl. No. 11/671,120, filed Feb. 5, 2007, and entitled Process for the Production of Highly-Textured, Band-Shaped, High-Temperature Superconductors (Provided as U.S. Publication 2007-0197045).

* cited by examiner

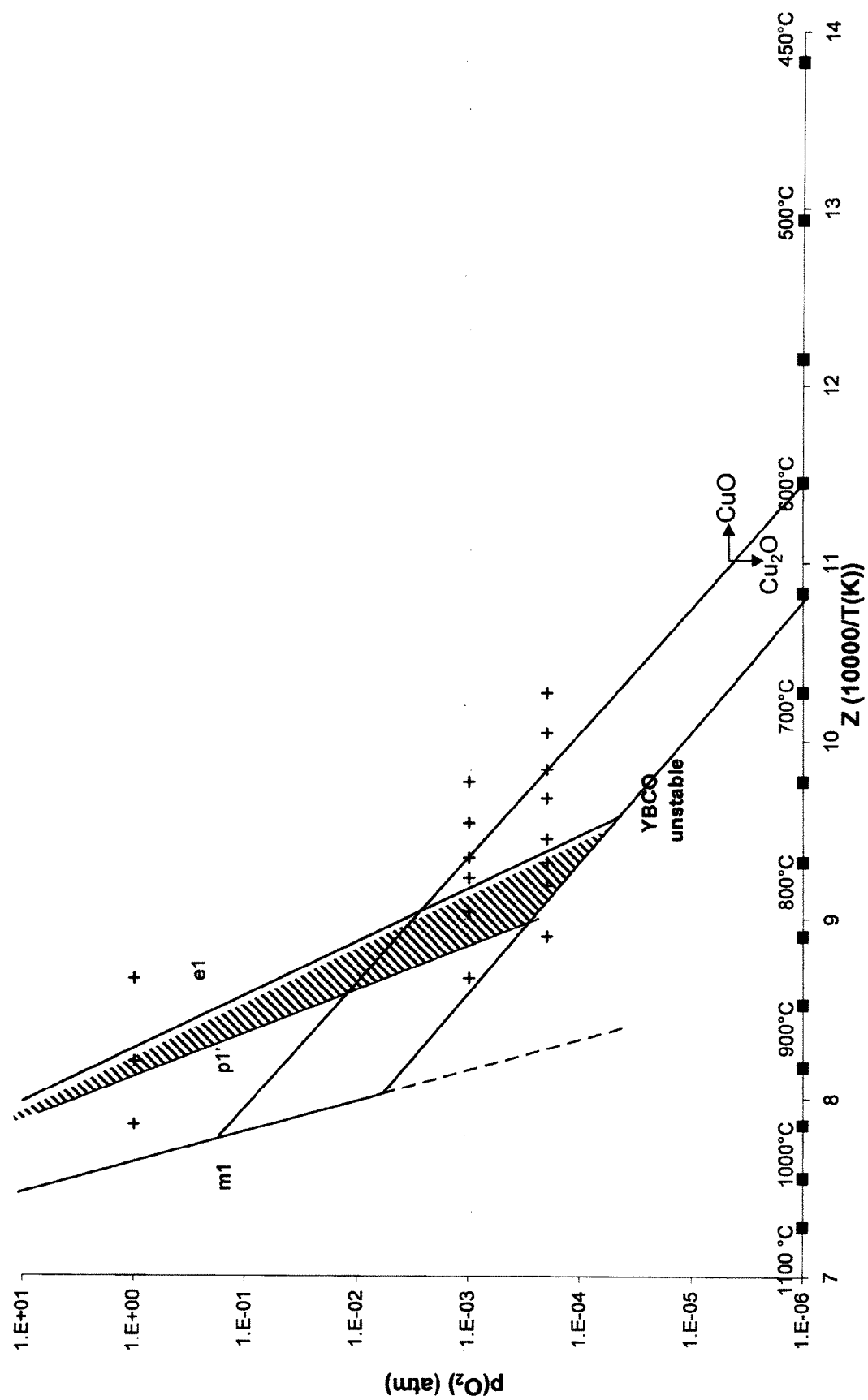

ature $T_z$.

WET-CHEMICAL METHOD FOR PRODUCING HIGH-TEMPERATURE SUPERCONDUCTOR

CROSS REFERENCE TO RELATED APPLICATIONS

This application is a continuation of International Application No. PCT/EP2009/000214, filed on Jan. 15, 2009, entitled "A Wet-Chemical Method for Producing a High-Temperature Superconductor," which claims priority under 35 U.S.C. §119 to Application No. DE 102008004818.6 filed on Jan. 17, 2008, entitled "A Wet-Chemical Method for Producing a High-Temperature Superconductor," the entire contents of which are hereby incorporated by reference.

FIELD OF THE INVENTION

The present invention is directed toward a method for wet-chemical production of a textured HTSC on a carrier without the use of fluorine-containing solvents.

BACKGROUND OF THE INVENTION

Textured HTSCs on a carrier are also known as thin-film HTSCs and differ from the conventional multifilament HTSCs that are produced according to the "powder in the tube" method and from HTSCs that are produced by pre-pressing and subsequent sintering of HTSC powder especially in such a way that the superconducting cross-sectional area of the thin-film HTSC is substantially smaller. That is why it is essential for thin-film HTSCs that the HTSC layer on the carrier has the highest possible critical current density. The critical current density depends very essentially on the fact that the HTSC does not have any warpage or the like on the carrier, i.e. the HTSC layer, and thus has the most even texture, which means it is textured. The texture of an HTSC layer can be determined by means of X-ray diffractometry.

In the wet-chemical production of thin-film HTSCs, the HTSC layer must be deposited as textured as possible on the carrier. This is influenced, among other things, by the composition of the precursor solution. Typically, trifluoroacetic acid (TFA) is used in the production of the HTSC precursor solution along with at least one organic salt and/or one organic solvent and/or one organic complexing agent. If no trifluoroacetic acid (TFA) is added to the HTSC precursor solution, barium carbonate is obtained during the later heat treatment. Barium carbonate is chemically very stable; consequently, barium bonded as carbonate is no longer available for the formation of the $REBa_2Cu_3O_x$ superconductor and obstructs current transport at the grain boundaries. If solvents with trifluoroacetic acid are used for the salts, barium fluoride is obtained instead of barium carbonate. Barium fluoride will react during heat treatment with water vapor to barium oxide and hydrofluoric acid. The problem is that the water vapor will at first diffuse into the HTSC precursor layer and the hydrofluoric acid needs to diffuse out of the layer. That is why only comparatively thin layers can be grown. Moreover, pores are obtained in the HTSC layer by the diffusion. It is a further disadvantage in the use of TFA that the obtained hydrofluoric acid is very poisonous and is still caustic when diluted.

It is generally understood that the problems in connection with hydrofluoric acid can be reduced by utilizing a multiple coating process in which a fluorine-free layer is applied to the carrier and, subsequently, a fluorine-containing (i.e. TFA-based) precursor solution is applied to the carrier to form the uppermost layer. The fluorine contained in the uppermost layer is sufficient, so that no relevant quantities of barium carbonate will be produced in the lower fluorine-free layer during the heat treatment.

Although methods for producing HTSC powders in which no TFA is used are generally known, it is not possible with any of these "TFA-free" methods to deposit a textured HTSC layer on a carrier.

SUMMARY OF THE INVENTION

The invention relates to a method for wet-chemical production of a textured high-temperature superconductor (HTSC) on a preferably strip-like carrier. For this purpose, an HTSC precursor solution is produced at first by dissolving rare earth (RE), barium (Ba) and copper (Cu) salts. The HTSC precursor solution is then applied to a preferably textured carrier and is preferably surface-dried. An amorphous layer is produced during drying from the salts. In the subsequent heat treatment, the salts are converted into a textured cuprate superconductor. In one embodiment, the process allows the formation of an HTSC precursor solution that is free from fluorine.

BRIEF DESCRIPTION OF THE DRAWINGS

FIG. 1 illustrates a graph showing the oxygen content of the furnace atmosphere (p) vs. maximum temperature (Z) during the heat treatment.

DETAILED DESCRIPTION OF THE INVENTION

The present invention is directed toward a method for the wet-chemical production of a textured HTSC layer on a carrier. A high temperature superconductor (HTSC) solution is prepared by dissolving rare earth (RE), barium (Ba) and copper (Cu) salts. The rare earth elements include rare earth metals such as yttrium and neodymium. The precursor solution is applied to a carrier to form an HTSC precursor layer, and then the precursor layer is heat treated. During the heat treatment, the HTSC precursor layer is heated to a first temperature that is greater than the decomposition temperature $T_z$ of the salt anions to produce barium carbonate and copper oxide. The HTSC precursor layer is thereafter heated to a second temperature $T_s$ at which the barium carbonate and the copper oxide partially melt in a binary reaction, but which lies beneath the temperature at which $RE_2BaCuO_x$ is formed. The HTSC precursor layer may be surface dried prior to heating to temperature $T_z$.

Thus, during the heat treatment of the precursor layer, the precursor layer is heated to a first temperature to cause the decomposition of the anions of the salts. In this process, barium carbonate, copper oxide and an oxide of the used rare earths (e.g. yttrium oxide ($Y_2O_3$)) are obtained. Thereafter, the precursor is heated to a second temperature $T_s$, with the temperature falling within a range at which the precursor layer will melt at least partially, but which is below the temperature in which non-superconducting $REBaCuO_x$ (e.g. $Y_2BaCuO_5$) is obtained. Specifically, at the second temperature $T_s$, an at least partial melt is obtained in a binary reaction from barium carbonate and copper oxide.

Preferably, temperature $T_s$ is chosen in such a way that a complete barium carbonate/copper oxide melt is obtained. The temperature $T_s$ depends on the atmosphere in the used furnace, especially its oxygen content, the used rare earth metal and the stoichiometry of the metals in the melt. By way of example, if a nitrogen atmosphere is in the furnace, Yttrium (RE=Y) is used as the rare earth metal. If the ratio of Y:Ba:Cu is 1:2:3, then $T_s$ is approximately 780° C. (partial melt from approximately 620° C., formation of $Y_2BaCuO_x$ from approximately 825° C., corresponding approximately to 620° C.≤$T_s$≤825° C.). By way of further example, if air is in the furnace (with RE=Y, Y:Ba:Cu as 1:2:3), then $T_s$ is approximately 900° C. (e.g., 780° C.≤$T_s$≤915° C.). If there is pure oxygen in the furnace (with RE=Y, Y:Ba:Cu as 1:2:3), then $T_s$ is approximately 926° C. (e.g., 810° C.≤$T_s$≤938° C.). The temperatures must be chosen slightly higher when using neodymium as a rare earth metal (i.e., RE=Nd).

As a result of the described choice of temperature, it is possible to omit TFA and other fluorine-containing additives in the production of the HTSC precursor solution. That is, the HTSC precursor solution can be free from TFA (and thus fluorine) because the $BaCO_3$ is unstable in the melt in the presence of CuO and disintegrates into a barium oxide (BaO) and carbon dioxide ($CO_2$). This is surprising because it has been generally assumed that $BaCO_3$ will only disintegrate at 1450° C.

The $CO_2$ obtained from the disintegration of $BaCO_3$ will outgas and the remaining BaO will react with CuO and the rare earth oxide (e.g. $Y_2O_3$) into $REBa_2Cu_3O_x$ (e.g. $YBa_2Cu_3O_x$, which is also known as YBCO). The $REBa_2Cu_3O_x$ (e.g. YBCO) will crystallize out on the carrier, with a texture transfer occurring from the uppermost (buffer) layer of the carrier to the $REBa_2Cu_3O_x$ layer.

Water is preferably used as a solvent for producing the HTSC precursor solution. The water can be acidified with acetic acid.

An amine may be added to the HTSC precursor solution. The amine includes, but is not limited, to, Triethanolamine (TEA) and/or ethylene diamine tetraacetate (EDTA). TEA and EDTA stabilize the ions in the precursor solution as complexing agents during the surface drying of the HTSC precursor solution.

Nitrates, tartrates, citrates, and/or acetates may be used as the salts (i.e., the RE, BA, and Cu salts) in the production of the HTSC precursor solution. These salts are easy to handle and the anions of these salts can be decomposed by the application of heat. The salts must preferably be dosed in the production of the HTSC precursor solution in such a way that RE:Ba:Cu is about 1:1.5-2.5:2.5-4, preferably about 1:1.5-2: 3-3.5.

Oxidic nanoparticles may further be added to the HTSC precursor solution to form so-called pinning centers for magnetic flux lines in the produced HTSC. In this manner, the critical current density of the HTSC can thus be increased. The same effect can be achieved by adding further metal salts.

In addition, the HTSC precursor solution may further include an organic salt, an organic solvent, an organic complexing agent, or combinations thereof.

The precursor solution preferably possesses a pH-value of between 3 and 9, and preferably possesses a pH of about 6.75.

Once the HTSC precursor solution has been applied to the carrier, its viscosity will be preferably set to approximately 1 mPas to approximately 30 mPas, and preferably to approximately 10 mPas.

During the heat treatment, the temperature at which barium oxide and copper oxide form a melt but no $RE_2BaCu_3O_x$ is obtained is maintained for at least 25 minutes. Thereafter, the HTSC can be cooled to a temperature $T_a$ of between approximately 380° C. and approximately 550° C., and preferably approximately 400° C. This temperature is may be kept substantially constant for at least 20 minutes.

While the HTSC precursor reacts at a temperature $T_s$ into $REBa_2Cu_3O_x$, the atmosphere in the used furnace preferably has an oxygen content of less than 20%, especially preferably less than 5%. Preferably, the HTSC is subjected to loading with oxygen of an atmosphere of at least 50%, preferably 100% oxygen, only when it cools off, e.g., when the furnace has cooled off to temperature $T_a$.

The carrier may be a metal strip with at least one ceramic buffer layer (e.g., a buffer layer made of lanthanum zirconate, cerium oxide or strontium titanate), or may be a purely ceramic carrier, e.g., made of strontium titanate or lanthanum aluminate. The carrier is preferably textured, i.e. it has a textured surface on which the HTSC is deposited, with a texture transfer being made from the carrier to the HTSC.

It is understood that several HTSC precursor solutions can be applied to the carrier and can then be heat-treated. Similarly, a further HTSC layer can be applied to an HTSC layer (e.g., at least two HTSC precursor layers may be applied successively on the carrier).

The invention is explained again on the basis of the following examples and FIG. 1.

Example 1

Y, Ba, and Cu acetate (Y:Ba:Cu as 1:2:3) were dissolved in water laced with acetic acid by cooking in return flow. Triethanolamine (TEA) was added to the thus produced HTSC precursor solution as a complexing agent. The ratio of the sum total of the metals (Y, Ba, Cu) to TEA was 1:2.5. The pH-value was set to approximately 6.75 by adding ammonia (approx. 25% by weight). The HTSC precursor solution was clear and blue. It was vaporized to a viscosity of approximately 9 mPas at approximately 60° C. and applied thereafter to a cleaned and degreased carrier made of polished (100) $SrTiO_3$ by immersion of the carrier into the HTSC precursor solution (drawing out speed approx. 50 mm/min). The carrier with the HTSC precursor solution was surface-dried for approx. 1 h at 60° C. The HTSC precursor solution was then gel-like. The subsequent heat treatment occurred in a furnace. The furnace with the HTSC precursor samples was heated with 10° C./min from room temperature to $T_s$=815° C. (800° C. to 835° C. were possible). An $N_2$ atmosphere with an $O_2$ content of approximately 200 ppm was in the furnace. After approx. 150 minutes, the furnace temperature was set to approximately 525° C. and the furnace atmosphere was exchanged for $O_2$. The furnace was cooled to approximately 400° C. and this temperature was held for approximately 30 minutes. After approx. 5 hours, the furnace was switched off and the HTSC samples were removed after cooling to room temperature. The characterization of the samples resulted in $T_c$=92K with $\Delta T_c$=5K and $J_c$=1.87 $MA/cm^2$.

Example 2

An HTSC precursor solution was produced according to example 1, applied to a carrier and surface-dried. The subsequent heat treatment occurred in an analogous fashion, but the furnace with the HTSC precursor samples contained an $N_2$ atmosphere with an $O_2$ content of 1000 ppm. The furnace was heated with 10° C./min from room temperature to $T_s$ of =838° C. (810° C. to approx. 890° C. were possible). The furnace temperature was reduced to approx. 525° C. 150 minutes after reaching $T_s$ and the furnace atmosphere was exchanged for $O_2$. The furnace was cooled to approx. 400° C. and this temperature was held for approx. 5 hours. The furnace was then switched off and the HTSC samples were removed after cooling to room temperature. The characterization of the samples resulted in $T_c$=92K with $\Delta T_c$=2K and $J_c$=1.28 $MA/cm^2$.

Example 3

Y, Ba and Cu acetate (Y:Ba:Cu as 1:2:3) were dissolved in water with 15% by volume of acetic acid by cooking in return flow (1 h, 90° C.). Thereafter, the pH value of the HTSC precursor solution was set to 6 by adding approx. 25% by weight of ammonia. TEA was added as a metal complexing agent, with the ratio of the sum total of the metal ions (Y, Ba, Cu) to TEA being 1:0.5. The HTSC precursor solution was clear, blue and had a pH of 6.2. It was subsequently applied to a degreased carrier made of polished (100) $SrTiO_3$ by immersion of the carrier in the HTSC precursor solution (drawing out speed approx. 50 mm/min). The HTSC precursor solution on the carrier was surface-dried for approx. 1 hour at 60° C. The subsequent heat treatment occurred in a furnace with $N_2$ atmosphere and 200 ppm $O_2$. The furnace was heated with the sample by approx. 10° C. $min^{-1}$ to 815° C. The final temperature was held approx. 150 min. Thereafter the furnace was cooled to a temperature of 525° C. and the atmosphere was exchanged for $O_2$. The furnace was cooled to approx. 400° C. and this temperature was held for approx. 5 hours. The furnace was then switched off and the HTSC samples were removed after cooling to room temperature. The characterization of the samples resulted in $T_c$=92K with $\Delta T_c$=4K and $J_c$=0.89 $MA/cm^2$.

Example 4

An HTSC precursor solution was produced according to example 3, but ethylene diamine tetraacetate (EDTA) was added instead of TEA, with the ratio of the sum total of the metal ions (Y, Ba, Cu) to EDTA being 1:0.5. The precursor solution was applied as in example 3 to an $SrTiO_3$ carrier and heat-treated. The characterization of the samples resulted in $T_c$=92K with $\Delta T_c$=4K and $J_c$=1.07 $MA/cm^2$.

Example 5

Diluted aqueous citric acid (1.8M) were added under stirring at air to an aqueous solution of Nd, Ba and Cu nitrate (Nd:Ba:Cu as 1:2:3) with a total concentration of 0.6M. The ph value was set to 6 with an aqueous ammonia solution in order to prevent the precipitation of the metal hydroxides and a recrystallization during the subsequent steps. The HTSC precursor solution was applied to a polished (100) and degreased $SrTiO_3$ carrier by immersion of the same (drawing out speed approx. 170 mm/min). The HTSC precursor solution on the carrier was subjected to 60° C. for several hours in a dust-free furnace until the consistency of the HTSC precursor solution or layer was gel-like. This was followed by a heat treatment for producing an HTSC. For this purpose, the carrier was heated in a furnace with 1° C./min to firstly 500° C. and then with 5° C./min to 940° C. An argon (Ar) atmosphere with 1% $O_2$ was in the furnace. Subsequently, the obtained $NdBa_2Cu_3O_x$ layer was annealed at 450° C. for 5 hours under an $O_2$ atmosphere and thus charged with oxygen. The characterization of the samples resulted in $T_c$=89K with $\Delta T_c$=10K and $J_c$=0.3 $MA/cm^2$. An examination of the HTSC layer with an atomic force microscope (AFM) showed a layer thickness of approx. 1 μm. The comparatively slow heating to 500° C. at first and then 940° C. was necessary so that no fissures would form in the HTSC precursor layer.

Example 6

As in example 1, an HTSC precursor solution was produced, applied, surface-dried and heat-treated. The sample was heated up to 850° C. No YBCO was obtained in this test, but non-superconducting $Y_2BaCuO_5$ which was identified by means of scanning electron microscopy on the basis of its characteristic needle-like structure.

Example 7

As in example 1, an HTSC precursor solution was produced, applied to a carrier, surface-dried and heat-treated. There was an $N_2$ atmosphere in the furnace with 1000 ppm $O_2$ and the sample was heated up to 880° C. No YBCO was obtained in this test, but non-superconducting $Y_2BaCuO_5$ which was identified by means of scanning electron microscopy on the basis of its characteristic needle-like structure.

FIG. 1 shows the oxygen content of the furnace atmosphere during the heating of samples of a test series to its respective maximum temperature during the heat treatment as entered against the respective maximum temperature. Each sample corresponds to one cross. The carriers of the samples were coated according to example 1 with an HTSC precursor solution. After the drying of the HTSC precursor solution, there was a heat treatment in a furnace with an $N_2$ atmosphere whose oxygen content was varied from sample to sample. The furnace was heated with the samples by approximately 10° C. $min^{-1}$ to the respective maximum temperature. This temperature was held for approximately 150 minutes. The cooling and the charging of the samples with oxygen occurred according to example 1. Only the samples whose crosses lie within the hatched area are high-temperature superconductive. $Y_2BaCuO_5$ was formed to the left of the hatched area. There was no binary reaction of $BaCO_3$ with CuO under formation of a melt to the right of the hatched area. The barium carbonate has decomposed and was thus not available for forming $YBa_2Cu_3O_x$.

Thus, above described process provides a method for the wet chemical production of an HTSC layer on a carrier, wherein an HTSC precursor solution comprising no trifluoroacetate may be utilized if the same is heated to a temperature $T_s$ during the heat treatment of the HTSC precursor, wherein the remaining substances of the HTSC precursor solution form at least a partial melt, which is below the temperature at which $RE_2BaCuO_x$ is formed, and which is deposited from the liquid phase while forming a peritectic. In this manner, an HTSC layer may be formed form a precursor solution that contains no fluorine.

While the invention has been described in detail and with reference to specific embodiments thereof, it will be apparent to one skilled in the art that various changes and modifications can be made therein without departing from the spirit and scope thereof. Thus, it is intended that the present invention covers the modifications and variations of this invention provided they come within the scope of the appended claims and their equivalents.

What is claimed is:

1. A method for the wet-chemical production of a textured HTSC layer on a carrier having an uppermost layer that is textured, the method comprising:
   producing an HTSC precursor solution by dissolving a rare earth element (RE), barium (Ba), and copper (Cu) salts, wherein RE is yttrium (Y), and the HTSC precursor solution is free from fluorine;
   applying the HTSC precursor solution to a carrier to form a high temperature superconductor (HTSC) precursor layer;
   heat treating the HTSC precursor layer by:

heating the HTSC precursor layer at first temperature $T_Z$ above the decomposition temperatures of anions of the copper salts to produce barium carbonate and copper oxide, and thereafter heating the HTSC precursor layer at a second temperature $T_S$ at which the barium carbonate and the copper oxide form an at least partial melt in a binary reaction and which lies beneath the temperature at which $RE_2BaCuO_x$ is formed, wherein the HTSC precursor layer is in an atmosphere with an oxygen content of less than 20% while subjected to the second temperature $T_S$.

2. The method according to claim 1, wherein water is used as a solvent in the production of the HTSC precursor solution.

3. The method according to claim 1 further comprising adding an amine to the HTSC precursor solution.

4. The method according to claim 3, wherein the amine is selected from the group consisting of triethanolamine, ethylene diamine tetraacetate, and combinations thereof.

5. The method according to claim 1, wherein the salts are selected from the group consisting of nitrates, tartrates, citrates, and acetates.

6. The method according to claim 1, wherein a ratio of RE:Ba:Cu in the HTSC precursor solution is 1:1.5-2.5:2.5-4.

7. The method according to claim 1, wherein a ratio of RE:Ba:Cu in the HTSC precursor solution is 1:1.5-2:3-3.5.

8. The method according to claim 1, further comprising adding oxidic nanoparticles to the HTSC precursor solution.

9. The method according to claim 1 further comprising:
maintaining the second temperature $T_S$ applied to the precursor solution for at least 25 minutes;
thereafter applying a third temperature $T_a$, the third temperature falling within a range of approximately 380° to 550° C.; and
holding the third temperature $T_a \pm 20°$ constant for at least 20 minutes.

10. The method according to claim 9, wherein:
$T_a$ is approximately 400° C.; and
temperature $T_a \pm 20°$ is held constant for at least 20 minutes.

11. The method according to claim 9, wherein the HTSC precursor layer is in an atmosphere with an oxygen content of at least 50% while it is subjected to temperature $T_a$.

12. The method according to claim 1, wherein the pH value of the HTSC precursor solution is set to a value of between 3 and 9.

13. The method according to claim 12, wherein the pH value of the HTSC precursor solution is approximately 6.75.

14. The method according to claim 1, wherein the HTSC precursor solution applied to the carrier possesses a viscosity of about 1 mPas to about 30 mPas.

15. The method according to claim 14, wherein the viscosity of the applied precursor solution is about 10 mPas.

16. The method according to claim 1, further comprising applying at least two layers of the HTSC precursor solution to the carrier.

17. The method according to claim 1 further comprising surface drying the HTSC precursor prior to heating to temperature $T_Z$.

18. The method according to claim 1, wherein:
the HTSC precursor solution further includes a compound selected from the group consisting of an organic salt, an organic solvent, an organic complexing agent, or combinations thereof, wherein the compound forms barium carbonate and copper oxide by decomposition of the salts; and
when heating to a temperature $T_S$, an at least partial melt is obtained from the barium carbonate and the copper oxide, during which the barium carbonate decomposes into barium oxide and carbon dioxide.

19. A wet chemical method of forming a textured high temperature superconductor (HTSC), the method comprising:
forming a fluorine free precursor solution including yttrium (Y), barium (Ba), copper (Cu) salts, and an amine selected from the group consisting of triethanolamine, ethylene diamine tetraacetate, and combinations thereof, wherein the pH value of the HTSC precursor solution is from 3 to 9;
applying the precursor solution to a substrate;
drying the HTSC precursor solution to form a high temperature superconductor (HTSC) precursor layer; and
heat treating the HTSC precursor layer to form a high temperature superconductor layer, wherein heat treating includes:
heating the HTSC precursor layer at first temperature $T_Z$ to produce barium carbonate, copper oxide, and yttrium oxide, and
heating the HTSC precursor layer at a second temperature $T_S$ effective to initiate a binary reaction at which the barium carbonate and the copper oxide form an at least partial melt, the second temperature falling below the temperature at which $Y_2BaCuO_5$ is formed, wherein the HTSC precursor layer is heated at the second temperature $T_S$ in an atmosphere having an oxygen content of less than 5%.

20. The wet chemical method of claim 19, wherein:
the precursor layer is heated at the second temperature $T_Z$ in an atmosphere having an oxygen content of 200 ppm to 1000 ppm; and
the ratio of Y:Ba:Cu in the precursor solution is 1:2:3.

21. The wet chemical method of claim 19, wherein heat treating further comprises heating the HTSC precursor layer at a third temperature $T_a$ in an atmosphere of at least 50% oxygen after heating the HTSC precursor layer at the second temperature $T_S$.

* * * * *